United States Patent [19]

Takata

[11] Patent Number: 4,827,322

[45] Date of Patent: May 2, 1989

[54] POWER TRANSISTOR

[75] Inventor: Ikunori Takata, Itami, Japan

[73] Assignee: Mitsubishi Denki Kabushiki Kaisha, Tokyo, Japan

[21] Appl. No.: 882,028

[22] Filed: Jul. 3, 1986

Related U.S. Application Data

[63] Continuation-in-part of Ser. No. 631,436, Jul. 6, 1984.

[30] Foreign Application Priority Data

Dec. 6, 1982 [JP] Japan .................................. 57-214953

[51] Int. Cl.⁴ .......................................... H01L 27/02
[52] U.S. Cl. ..................................................... 357/46
[58] Field of Search ............................................ 357/46

[56] References Cited

U.S. PATENT DOCUMENTS

| | | | |
|---|---|---|---|
| 4,136,355 | 1/1979 | Mizukoshi et al. | 357/51 |
| 4,167,748 | 9/1979 | D'Angelo et al. | 357/46 |

FOREIGN PATENT DOCUMENTS

| | | | |
|---|---|---|---|
| 50-80777 | 7/1975 | Japan | 357/46 |
| 52-94779 | 8/1977 | Japan | 357/46 |
| 52-96870 | 8/1977 | Japan | 357/46 |
| 55-158666 | 10/1980 | Japan | 357/46 |
| 56-101772 | 8/1981 | Japan | 357/46 |
| 1035727 | 7/1966 | United Kingdom | 357/46 |

OTHER PUBLICATIONS

*High Voltage High Power Transistor Modules,* Hiroshi Nishiumu Semiconductor Manufacturing Dept., Mitsubishi Electric Corp.

*Primary Examiner*—Martin H. Edlow
*Attorney, Agent, or Firm*—Lowe Price LeBlanc Becker & Shur

[57] ABSTRACT

A power transistor according to the present invention improves breakdown resistance, in a monolithic structure for connecting a first-stage transistor and a second-stage transistor in Darlington connection, by constructing the same such that no parasitic transistor is substantially formed in the area for connecting the first-stage and second-stage transistors.

27 Claims, 12 Drawing Sheets

CIRCUIT DIAGRAM OF R. B. SOA OR $V_{CEX(SUS)}$ TEST.

$V_{CEX(SUS)}$
50A, 1000V CONVENTIONAL SPECIFICATION TRANSISTOR $V_{CEX(SUS)}$
50A, 1000V CONVENTIONAL SPECIFICATION TRANSISTOR $V_{CEX(SUS)}$
50A, 1000V NEW SPECIFICATION TRANSISTOR $V_{CEX(SUS)}$
50A, 1000V NEW SPECIFICATION TRANSISTOR

POWER TRANSISTOR

This application is a continuation-in-part of application Ser. No. 631,436, filed July 6, 1984.

FIELD OF THE INVENTION

The present invention relates to a power transistor of a Darlington structure in which a portion connecting a front stage transistor and a rear stage transistor is provided free of parasitic transistors.

BACKGROUND OF THE INVENTION

In a power transistor conventionally used for a chopper circuit and an inverter circuit, a breakdown phenomenon is caused by the so-called "dv/dt current".

That is, when, in a conventional chopper circuit, a transistor $Tr_B$ as shown in FIG. 1 repeats on-off operations, a transistor $Tr_A$ connected in parallel to a load L is subjected to a breakdown phenomenon caused by a "dv/dt current".

The breakdown phenomenon by the "dv/dt current" is caused in such a manner that, when an abrupt source voltage accompanying the on-operation of the transistor $Tr_B$ is applied between a collector and an emitter of the transistor $Tr_A$, a high current to the transistor $Tr_A$ to increase an electrical loss, finally leading to breakdown of the transistor $Tr_A$.

When, in the chopper circuit as shown in FIG. 1, the transistor $Tr_B$ is turned on, a voltage $V_{CE}$ between the collector and the emitter of the transistor $Tr_A$ and a source current $I_{TD}$ flowing to the transistor $Tr_A$ and a diode $D_A$ are changed as shown in FIG. 2.

Since, as shown in FIG. 2, a high source current $I_{TD}$ flows simultaneously with rising of the voltage $V_{CE}$, the transistor $Tr_A$ generates significant heat in response to on-off operations of the transistor $Tr_B$.

And, when the source voltage is further raised, the source current $I_{TD}$ is all the more increased, finally leading to breakdown of the transistor $Tr_A$.

It is to be noted that the characteristics of the voltage $V_{CE}$ and the current $I_{TD}$ as shown in FIG. 2 are waveforms in a case where the base of the transistor $Tr_A$ is in an open state.

In a conventional Darlington-connected transistor structure, as shown in FIG. 3, a front stage transistor $Tr_1$ and a rear stage transistor $Tr_2$ are generally provided with resistances $R_{EB1}$ and $R_{EB2}$ between bases and emitters, respectively.

FIG. 4 is a plan view of the Darlington-connected transistor as shown in FIG. 3, and FIG. 5 is a cross-sectional view thereof taken along the line V—V in FIG. 4.

As shown in FIG. 5, a conventional Darlington-connected transistor structure comprises a first stage, or front stage transistor $Tr_1$ and a second stage, or rear stage transistor $Tr_2$, in which the front stage transistor $Tr_1$ has an emitter layer (1), a base layer (6), a collector layer (5) and an emitter electrode (3), and the rear stage transistor $Tr_2$ has an emitter layer (2) and a base layer (7) and a collector layer (5) respectively communicating with the base layer through a resistance and the collector layer of the front stage transistor $Tr_1$.

Further, since the rear stage transistor $Tr_2$ is connected with the front stage transistor $Tr_1$ in a Darlington connection manner, the emitter electrode (3) of the front stage transistor $Tr_1$ is electrically connected with a base electrode (4) of the rear stage transistor $Tr_2$ as shown in FIG. 3.

Still further, for the purpose of adjusting the resistance $R_{EB1}$ between the base and the emitter of the front stage transistor $Tr_1$ as shown in FIG. 3 to an appropriate value, the resistance of the base layer (6) of the front stage transistor $Tr_1$ has been increased by prolonging the emitter layer (1) of the front stage transistor $Tr_1$ toward the rear stage transistor $Tr_2$ as shown in FIG. 5.

However, in the Darlington-connected transistors of such structure, there is sometimes caused, in practice, increase of the so-called dv/dt current, which is a problem to be solved at this time. Thus, in a monolithic Darlington Structure, the first stage transistor needs to be substantially separated from the second stage transistor on the same chip. If such a separation is achieved by a typical mesa type structure, a groove must be formed between the transistors Tr1 and Tr2, as shown in FIGS. 24–25. Since the thickness of the N region in FIG. 25 is relatively larger in a high breakdown transistor, the width of such a groove cannot be neglected. In addition, due to such grooves, interconnection between the transistors Tr1 and Tr2 cannot be formed on the chip, which is very inconvenient.

For this reason, practical devices hardly ever adopt the structure shown in FIG. 24, but instead adopt the structure as shown in FIG. 26. In such a case, only the peripheral portion of a chip has a mesa structure. Such a structure is known in the prior art, as illustrated by the drawings in U.S. Pat. No. 4,136,355 to Mizukoshi.

In this type of structure, the base of the transistor Tr1 and the base of the transistor Tr2 are formed as a common region and hence the resistance between the bases of the transistors Tr1 and Tr2 becomes lower. As a result, the current amplifying factor of a transistor, hFE, cannot be made large, as described in the above mentioned patent. As a countermeasure for that, the dimension "l1" of the prior art patent is made longer so that resistance in both base regions can be made higher. Thus, it is clear that the prior art, illustrated by the Mizukoshi patent intends to provide a high resistance with small area, in an efficient manner.

However, the Mizukoshi patent discloses an obstruction part 131 which appears to provide a parasitic transistor as defined below. Where such a obstruction part is provided, the structure shown in the Mizukoshi patent is not sufficient to suppress operation of such a parasitic transistor. Instead, as described below, it is much more effective to separate the majority of connecting portion of the first and second stage transistors in their collector area (5), as shown in FIGS. 10, 13 and 14 of the present application.

Thus, the Mizukoshi structure offers no advantages for a monolithic transistor of a type having a planar structure. Indeed, the structure of the prior art is basically inferior to a planar device as described herein, from the view point of adverse influence by a parasitic transistor formed therein, which is eliminated by the present invention.

DISCLOSURE OF THE INVENTION

It is accordingly an object of the present invention to improve breakdown resistance of a power transistor by eliminating a parasitic transistor which can be formed by connecting the first and second stage transistors in a Darlington connected structure.

The object of the present invention is not to control a contained resistance, as in the above described prior art, but rather to remove an inherent, spare and undesirable transistor which is automatically formed in a conventional monlithic Darlington transistor, which is known as a parasitic transistor.

A parasitic transistor is defined as existing in a region connecting the first stage transistor to the second stage transistor, which may include the first stage transistor, wherein an ON current flows when the first stage transistor is ON, and wherein delay is introduced in turning OFF the first stage transistor when the base-emitter of the first stage transistor is reverse-biased. The delay is introduced by flow of the ON current in the region, which delays application of the reverse-bias voltage between the base and emitter of the first stage transistor as compared with the major portin of the first stage transistor. In order to eliminate such a parasitic transistor, it is desirable that a structure of connection of an emitter pattern and a semiconductor region for a base electrode can be made uniform. In addition, it can be generally said that an area acting as an emitter of the first stage transistor should not be formed in a location removed from the base-contact area of the first stage transistor.

With respect to a power transistor according to the present invention, the cause of the increase in the so-called dv/dt current in the conventional Darlington-connected transistors has been researched to find out that the increase in the dv/dt current is primarily caused by a parasitic transistor and a second-stage transistor in a Darlington manner in the area of connection thereof, and the present invention accordingly provides a Darlington-connected transistor in which substantially no parasitic transistor is formed in an area for connecting first- and second-stage transistors, thereby enabling implementation of a power transistor having considerable breakdown resistance.

In accordance with the present invention, a substantial separation between the transistors Tr1 and Tr2 can be readily achieved for a planar transistor. This becomes possible by removing a narrow base diffusion region between the transistors Tr1 and Tr2, as shown in FIG. 4 herein. THe spacing of the narrow region is several tens μm. Such removal of the narrow region can be achieved by a modification of the photolithographic mask pattern for formation of the base region, Thus, by using a simple approach, the resistance between the bases of the two transistors advantageously can be made higher.

BRIEF DESCRIPTION OF THE DRAWINGS

FIG. 14 shows an example wherein an emitter of the first stage transistor is formed in a "#", or grid-like fashion, wherein the base electrode of the first stage transistor is omitted for simplicity, while FIG. 27 shows an enlarged portion of FIG. 28.

BEST MODE FOR CARRYING OUT THE INVENTION

Before describing the present invention, explanation is now being made with respect to the dv/dt current.

Figure 6:
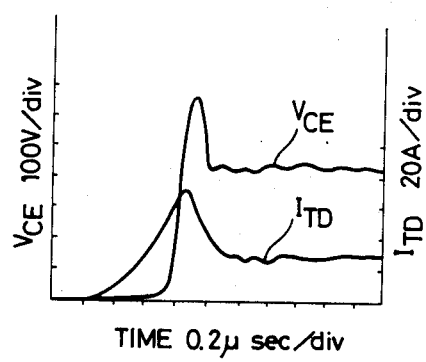
FIG. 6 is a voltage-to-current characteristic diagram in a case where a reverse bias is applied to the base of a transistor $Tr_A$ in a chopper circuit for explaining the present invention.
Figure 7:
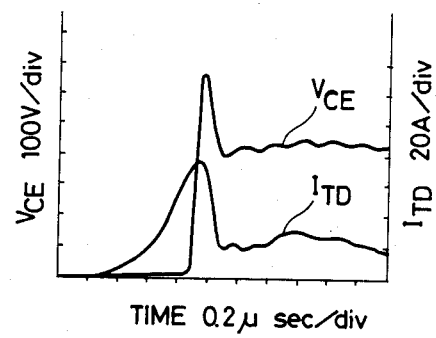
FIG. 7 is a voltage-to-current characteristic diagram in a case where the transistor $Tr_A$ is removed from the chopper circuit for explaining the present invention.

FIG. 6 is a characteristic diagram of a collectoremitter voltage $V_{CE}$ of a transistor $Tr_A$ and the diode $D_A$ and a source current $I_{TD}$ flowing through the transistor $Tr_A$ in a case where a reverse bias is applied to the base of the transistor $Tr_A$ in a chopper circuit, and FIG. 7 is a voltage-to-current characteristic diagram in a case where the transistor $Tr_A$ is removed so that only a flywheel diode $D_A$ is connected in parallel to a load L.

Figure 2:
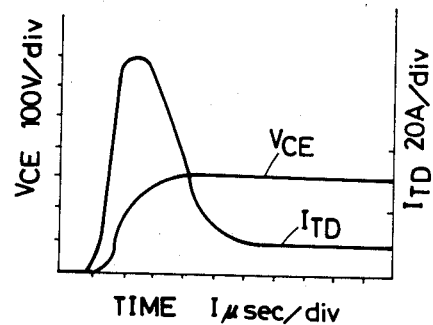
FIG. 2 is a waveform diagram of a voltage $V_{CE}$ of a transistor $Tr_A$ forming the chopper circuit shown in FIG. 1 and a current $I_{TD}$ flowing through the transistor $Tr_A$ and a diode $D_A$.

When comparing FIG. 6 and FIG. 7 with each other, both the diagrams are well consistent in their characteristics with each other and accordingly it seems that the transistor $Tr_A$ is not substantially operated when the reverse bias is applied to the base of the transistor $Tr_A$. However, when FIG. 7 is compared with FIG. 2, the characteristics are extremely different from each other. The difference is what is called the dv/dt current, which is significantly changed by application of a reverse bias between the base and the emitter of the transistor $Tr_A$, and is considered to depend on the transistor structure.

In consideration of such a point, the present invention has contemplated Darlington-connected transistors in a high-power transistor.

Figure 1:
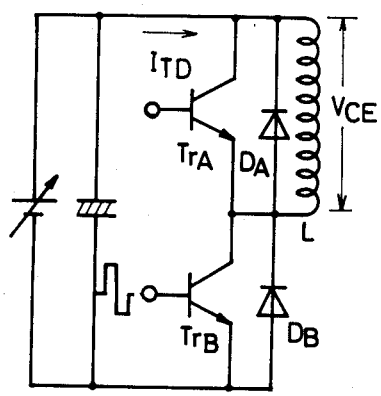
FIG. 1 is a fundamental block diagram showing a conventional chopper circuit.
Figure 8:
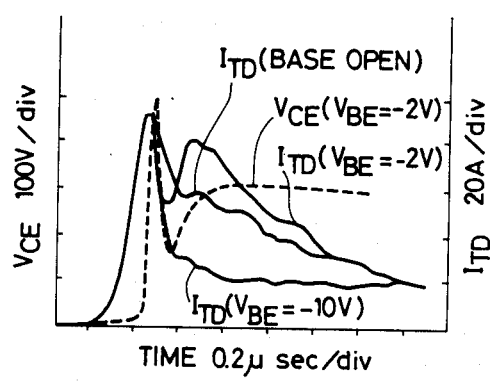
FIG. 8 is a voltage-to-current characteristic diagram in a case where Darlington-connected transistors are applied to a chopper circuit for explaining the present invention.

Accordingly, a Darlington-connected transistor structure has been applied to the chopper circuit as shown in FIG. 1 in the explanation of the prior art with addition of a speed-up diode $D_S$, to measure a collector-to-emitter voltage $V_{CE}$ of the Darlington-connected transistors and a source current $I_{TD}$ in an open base state, thereby obtaining a voltage-to-current characteristic diagram as shown in FIG. 8.

Observed here is a phenomenon that, even in a case as shown in FIG. 8 in which the current $I_{TD}$ is not significantly increased in the open base state, the current $I_{TD}$ is remarkably increased by slight application of a reverse bias between the base and the emitter in comparison with the open base state, and again the current $I_{TD}$ is decreased by application of a greater reverse bias between the base and the emitter.

It can be considered that this is because current density in the conductive area is increased by a contracting action caused in the conductive area by the reverse bias when a slight reverse bias is applied between the base and the emitter.

Such a phenomenon is considered to be caused by a parasitic transistor formed between the front stage transistor and the rear stage transistor.

In such a manner, the inventor of the present invention has discovered, based on a large number of experiments and analysis, that the increase in the so-called dv/dt current in the Darlington-connected transistor structure is caused by formation of the parasitic transistor, as hereinabove described.

Figure 5:
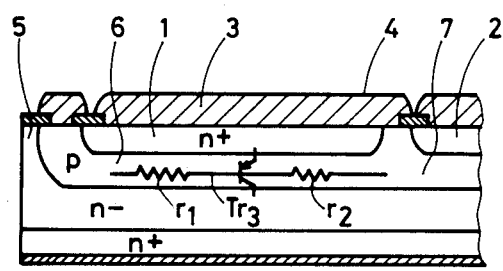
FIG. 5 is a cross-sectional view thereof taken along the line V—V in FIG. 4.
Figure 9:
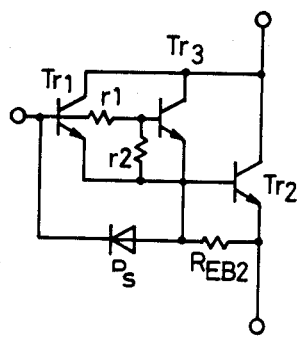
FIG. 9 is an equivalent circuit diagram of Darlington-connected transistors in consideration of a parasitic transistor.

Thus, such a parasitic transistor Tr3 is shown in FIG. 5 which shows the structure of the conventional Darlington-connected transistors, and in consideration of this parasitic transistor Tr3, there can be obtained an equivalent circuit diagram as shown in FIG. 9.

When, in such Darlington-connected transistors, a reverse bias is applied between the base and the emitter thereof, the reverse bias value $V_{EB}(Tr_3)$ between the base and the emitter of the parasitic transistor Tr3 is expressed in the following equation, in a small value:

$$V_{EB}(tr_3) = V_F(D_S) \times r_2/(r_1+r_2) \qquad (1)$$

wherein $V_F(D_S)$, and $r_1$ and $r_2$, respectively, represent layer resistances as shown in FIG. 5. Thus, it may be said that almost no reverse bias is applied between the base and the emitter of the parasitic transistor Tr3.

Since, in general, the parasitic transistor Tr3 is merely subjected to a remarkably small part of the current flowing from the emitter to the collector, it may be left out of consideration.

However, in a high-power transistor, due consideration must be given since the area in which such a parasitic transistor Tr3 is formed is enlarged while, further, the dv/dt current is amplified by the rear stage transistor.

At this point, the power transistor according to the present invention is constructed in such a manner that, in monolithic Darlington-connected transistors, no parasitic transistor is formed in an area in which a first-stage emitter layer and a base layer of a secondstage transistor are connected.

FIG. 9 shows an equivalent circuit of a monolithic Darlington transistor having a resistance between the first stage and the second stage. In FIG. 9, the transistors Tr1 and Tr2 indicate, respectively, a typical first stage transistor and the second stage transistor and a parasitic transistor is represented by Tr3. The distinction between the transistor Tr1 and a parasitic transistor Tr3 is rather delicate, as described below.

As may be appreciated from the foregoing, the parasitic transistor Tr3 which adversely affects operation of a chopper circuit as shown in FIG. 1 is a portion of the semiconductor structure wherein at least some ON current flows when the whole transistor is turned ON, and wherein the operation of turning the transistor OFF is delayed due to difficulty in applying a reverse bias across the base-emitter junction when the whole transistor is turned OFF. In order for a current to flow when turning the transistor ON, this portion of the structure has to be adapted to have a relatively small value of resistance $r_1$ to the external electrode, wherein $r_1$ is shown in FIG. 9. However, in this portion of the circuit the resistor $r_2$ (also shown in FIG. 9) from the base of the second stage transistor is smaller than $r_1$, as seen from the equation representing a reverse bias voltage to the base-emitter hereinabove described at Equation (1). The resistors $r_1$ and $r_2$ are seen in detail in the structure of the Darlington transistor assembly shown at FIGS. 27-30.

Figure 13:
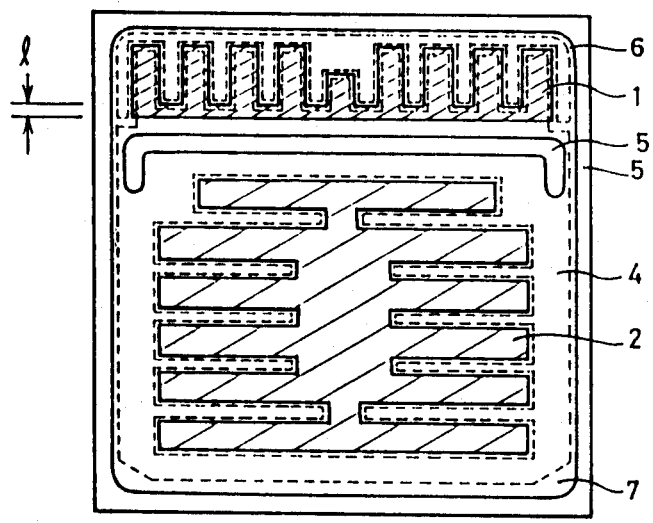
FIG. 13 is a typical embodiment of the present invention.
Figure 27:
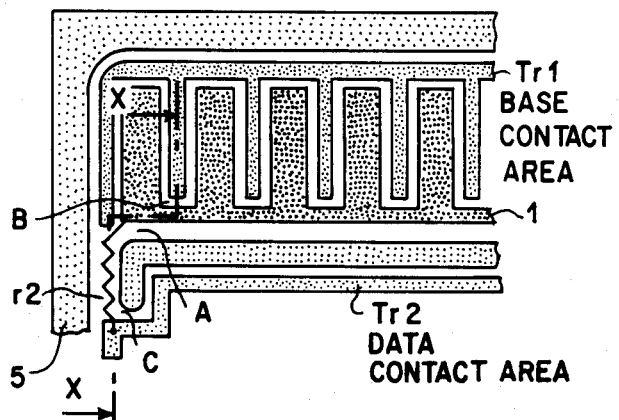
FIG. 27 shows a detail of the upper left hand portion of FIG. 13.
Figure 28:
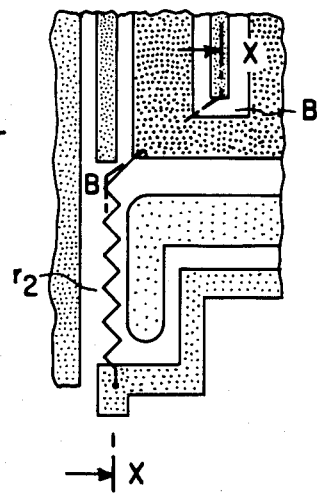
Figure 29:
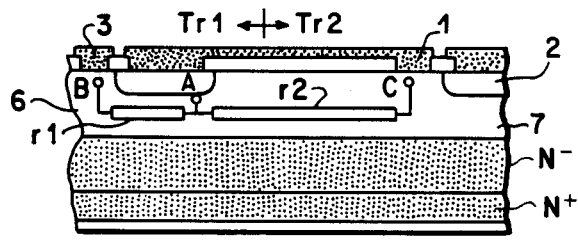
FIG. 29 shows a cross sectional view taken along lines X—X of FIG. 28.
Figure 30:
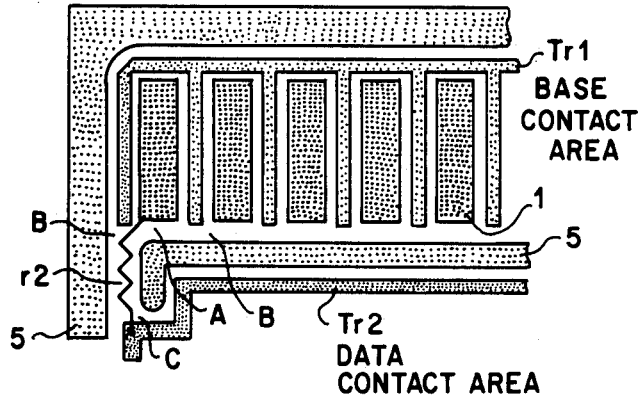
FIG. 30 shows a modification of the embodiment of FIG. 27.

Accordingly, the base structure of a circuit without any parasitic transistor may be structured as shown in FIG. 13, but with omission of space "l" therefrom. FIG. 27 shows a detail of the upper left hand portion of FIG. 13, including an illustration of resistances $r_1$ and $r_2$ therein. FIG. 28 shows an enlargement of the portion of FIG. 27 used to illustrate the location of the resistors $r_1$ and $r_2$. The modified version of FIG. 13, wherein the space "l" has been omitted, is shown in FIG. 30. In the structure shown in FIGS. 13, 27 and 28, the resistor $r_2$ can have a large resistance value and $r_1$ can have a small resistance value, anywhere in the emitter region of the first stage transistor.

Figure 10:
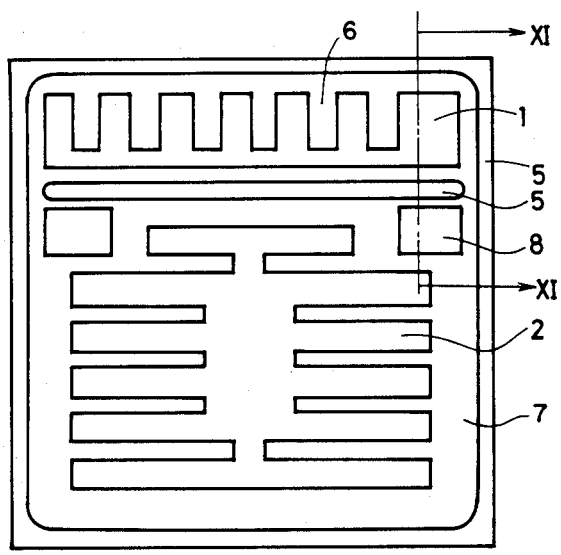
FIG. 10 is a plan view showing a definite embodiment of the present invention wherein an emitter diffusion, together with a portion of the collector projecting through the base layer, separate the first and second stage transistors.

With a planar type of structure, in which most of the separations between the transistors Tr1 and Tr2 are provided by P-N junctions, $r_2$ can have a very large value of resistance, except for both ends of connecting portions of the transistors Tr1 and Tr2. Accordingly, it is usually difficult for a parasitic transistor to be formed elsewhere than at these ends. With respect to the two ends, formation of a parasitic transistor can be inhibited by making the resistor $r_2$ larger by expanding the narrow region (5), separating the transistor Tr1 from the transistor Tr2, along the collector base junction to form an inverted 'U' structure as shown in FIG. 13, or by providing a region (8) having a floating potential relative to the base, as shown in FIG. 10.

On the other hand, for prior art type structures as shown in the U.S. Pat. No. 4,136,355 the base regions of the transistors Tr1 and Tr2 are connected over the whole of the connecting portion of the transistors Tr1 and Tr2 and hence a parasitic transistor may be formed in the entire region of the connecting portion, without making the value of the resistor $r_2$ as large as the planar type structure. For this reason, if and when a chopper arrangement is provided as shown in FIG. 1, the structure is easily broken over in a high voltage condition even if a reverse bias is applied between the base-emitter.

Figure 15:
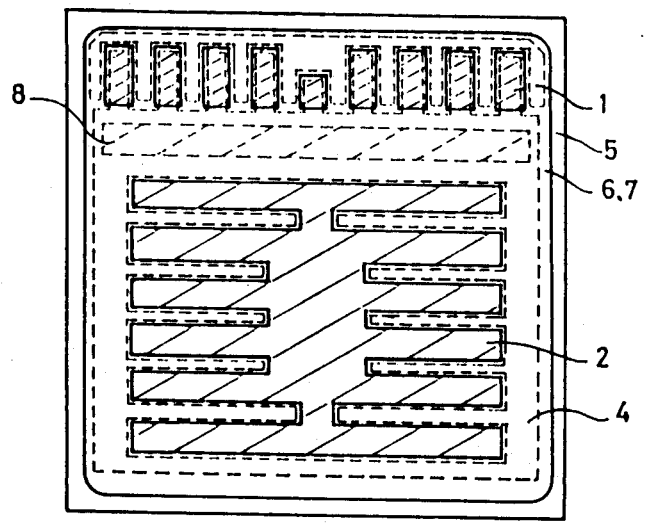
FIG. 15 shows an example wherein a separation of the first stage transistor from the second stage transistor is not made in the collector region (5)

However, even with a mesa type structure, if emitter regions of the first stage transistor are formed in the connecting portions of the base electrode, as shown in a structure illustrated in FIG. 15, there are no portions in these regions which provide a delay in operation, which means that no parasitic transistor is formed therein.

It is clear from the above described patent that the prior art did not consider the adverse influence of a parasitic transistor on operation of a chopper circuit as shown in FIG. 1. More particularly, in the left portion of FIG. 3b in the U.S. Pat. No. 4,136,355, the latter stage transistor is formed with a short emitter by a resistor $R_2$, but a transistor with a short emitter structure necessarily breaks down when the frequency of chopper operation is increased. See, for example, applicant's paper, H. Nishiumi et al, "High Voltage High Power Transistor Modules for 440V AC Line Voltage Inverter Application" published in Conference record of IPEC TOKYO '83 pp. 297-305. The reason is that operation in the vicinity of the short emitter portion is delayed. All of the drawings in U.S. Pat. No. 4,136,355 patent show a latter stage transistor having a short emitter structure. In addition, the region (152) connected to the emitter region of the transistor Tr$_1$ and interposed between N regions in FIG. 4a is a typical parasitic transistor which is the very problem raised and solved in the present invention.

Figure 11:
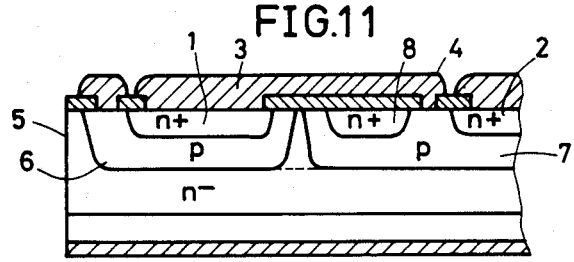
FIG. 11 is a crosssectional view thereof taken along the line XI—XI in FIG. 10.

For further detailed description of the present invention, FIG. 10 and FIG. 11 are used. FIG. 10 is a plan view showing a specific embodiment of the present invention, and FIG. 11 is a cross-sectional view thereof taken along the line XI—XI in FIG. 10.

In FIG. 11, a base layer (6) of a front stage transistor Tr$_1$ and a base layer (7) of a rear stage transistor Tr$_2$ partially communicate with each other through a narrow region between the two portions of the collector layer marked with reference numeral 5 as seen from FIG. 10. A coupling area, between the bases 6 and 7 of the two transistors, is thus interrupted by a projection of collector conductivity material, shown as a narrow strip 5 in FIG. 10. The separating structure is further shown in FIG. 11 as separating the two base regions by projecting from the collector region to an isolating layer on the surface of the semiconductor material. As is also seen in FIGS. 10 and 11, an n+-type region (8) is formed in the coupling portion of the transistors Tr$_1$ and Tr$_2$. As seen in the drawing, the additional region (8) is formed to the same depth below the major surface of the semiconductor as are emitters 1 and 2. Further, the additional portion has a lateral dimension (shown horizontally between the first and second stage transistors in FIG. 11) which is smaller than the emitter area in the first stage transistor.

That is, formation of the aforementioned parasitic transistor is prevented in the above embodiment by forming the aforementioned n+-type region (8). This region is provided at a floating potential, so that existence of the parasitic transistor is no longer a significant factor.

With such structure, as a result of measurement of a safe operating area of the reverse bias in a running test, while the breakdown resistance of a power transistor having conventional structure has been about 600 V due to the formation of the parasitic transistor, the breakdown resistance has been improved approximately to 1000 V in the aforementioned embodiment according to the present invention since formation of the parasitic transistor can be prevented.

Figure 3:
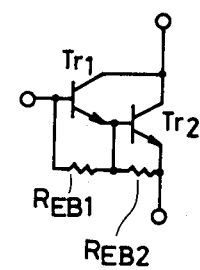
FIG. 3 is a circuit diagram of a conventional Darlington-connected transistor.
Figure 12:
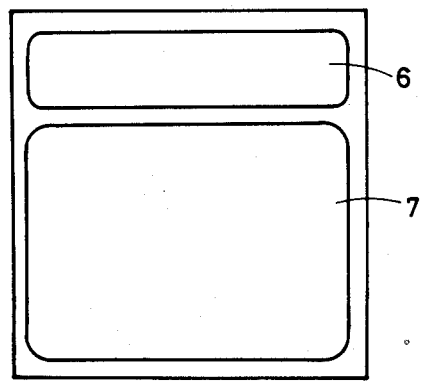
FIG. 12 is a cross-sectional view showing another specific embodiment of the present invention.

The aforementioned Darlington-connected power transistors have been described with respect to a case where the resistor R$_{EB}$ is connected to the front stage transistor Tr$_1$ as shown in FIG. 3, and the resistor R$_{EB}$ functions to increase a static collector-to-emitter reverse-blocking voltage BV$_{CEO}$ of the transistor to the extent of a collector-to-base reverse blocking voltage BV$_{CBO}$. It further functions to reduce a displacement current caused by dv/dt generated even when no electric charge remains in the collector area. However, when these functions are not required or they can be covered by sufficiently performing the base-to-emitter reverse bias, the parasitic transistor can be completely eliminated by an alternate embodiment of the invention shown in FIG. 12. Therein, the base layer (6) of the front stage transistor and the base layer (7) of the rear stage transistor are completely uncoupled in the diffusion layer.

The configuration shown in FIG. 13 is a further, typical, embodiment of the present invention. In this case, the resistor (R$_{EB1}$) between the bases of the first and second stage transistors is formed in an elongate region interposed between the two edges of the collector area (5) on the chip. The major portion of the emitter of the first stage transistor is formed adjacent to the base contact. Although a portion (l) in the drawings becomes an exceptional portion to the major portion of the first stage emitter, i.e., is extended therefrom, this portion is sufficiently narrow to prevent any substantial operation of a parasitic transistor. More specifically, because the width of the portion is narrow, the resistance of a portion in FIG. 13 corresponding to the resistor r2 in FIG. 9 is increased to a large value.

Figure 14:
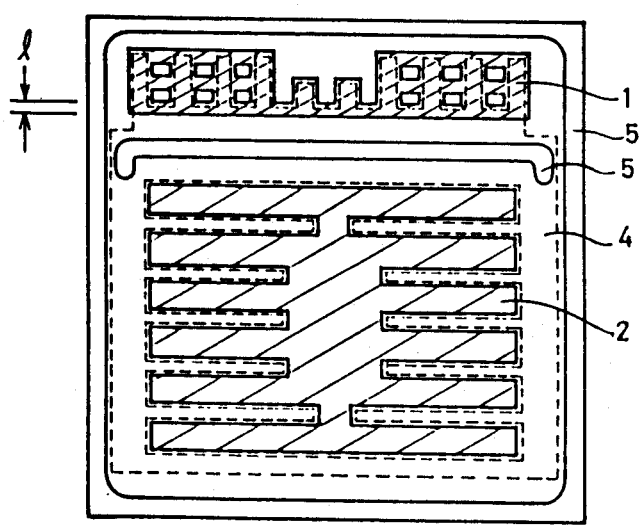

FIG. 14 shows an example wherein an emitter of the first stage transistor is formed in a "#", or grid-like fashion, where the base electrode of the first stage transistor is omitted for simplicity, while FIG. 15 shows an example wherein a separation of the first stage transistor from the second stage transistor is not made in the collector region (5). The area (8) shown in FIG. 15 by a dotted line is a region having a floating potential and having the same conductivity as that of the emitter region. Provision of such a region makes the resistance R$_{EB1}$ larger, which is advantageous for characteristic of conventional transistor. In addition, since the resistance r2 becomes larger due to this area (8), the problem of a parasitic transistor is reduced. When there is no region, such as region (l) in FIGS. 13 and 14, which is turned OFF slowly as compared with the major portion, operation of a parasitic transistor never occurs.

More particularly, for the base connecting structure shown in FIG. 15, the magnitude of r2 cannot be made larger as compared with the structures shown in FIG. 10, FIGS. 13 and 14, irrespective of the presence or absence of the region (8) and, in order to suppress the operation of the parasitic transistor, the exceptional portion of the first stage emitter shown by (l) should be made as small as possible. It is even practical to remove such a portion. Of course, it is desirable to remove the portion designated by (l) even in the embodiment of FIGS. 10, 13 and 14 from the point of view of preventing adverse effect of the parasitic transistor. However, as compared with the embodiment of FIG. 15, there is less adverse effect of the portion designated by (l) in the FIGS. 10, 13 and 14 embodiments and hence, there is no problem in practical use if the width thereof is narrower.

Figure 16:
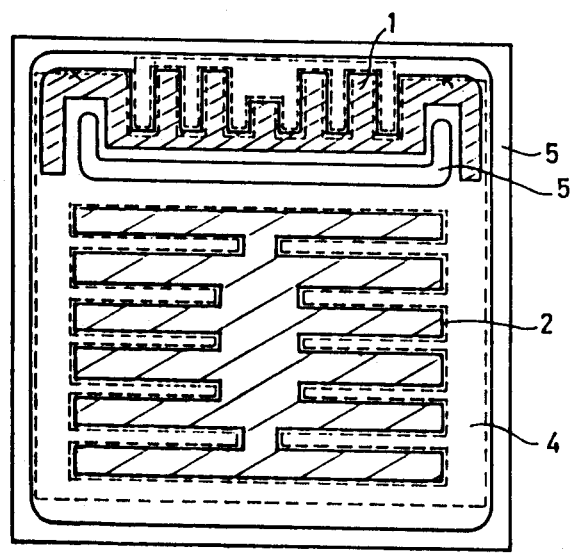
FIG. 16 shows breakdown points in an embodiment of a Darlington transistor pair.
Figure 17:
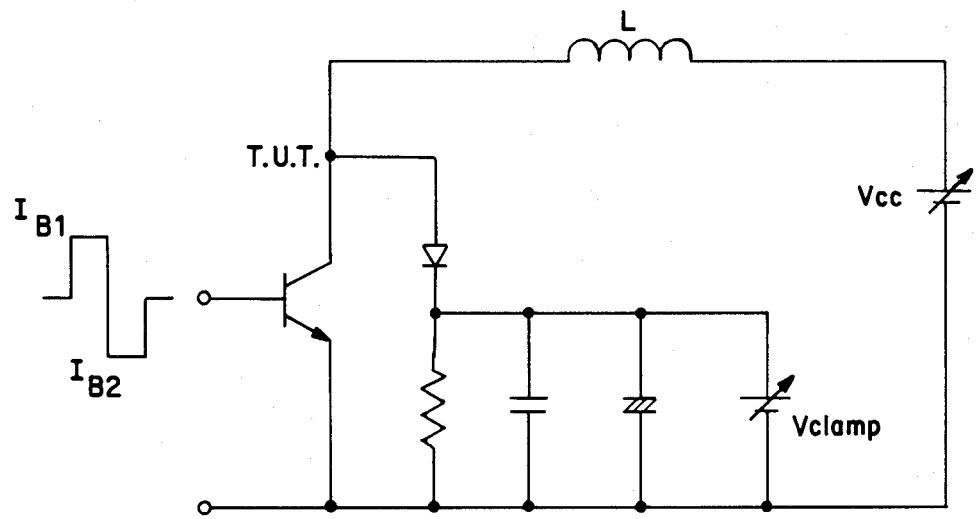
FIG. 17 shows a circuit used for measuring a high voltage characteristic of a transistor.

Further, meritorious effects of elimination of parasitic transistor may be explained by FIGS. 16-23. Referring to FIG. 17, a method for measuring a high voltage characteristic of a transistor is described. If and when the T.U.T. (transistor under test) is rendered to be OFF by reversing a base current of the T.U.T., a counter electromotive force is generated in the coil (L) corresponding to a decrease of collector current (I$_c$) and hence, the T.U.T. is subjected to a high voltage. A diode, a capacitor, a resistor and a power supply designated by V$_{clamp}$ in FIG. 17, constitutes a clamping circuit and serves to prevent a voltage higher than the V$_{clamp}$ from being applied to the T.U.T.

Figure 4:
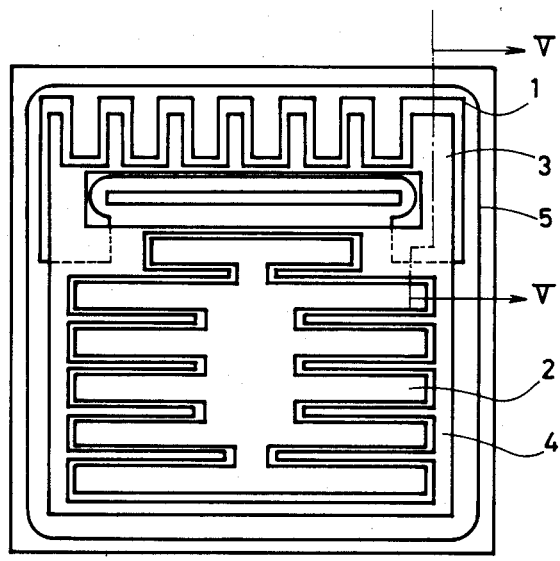
FIG. 4 is a plan view of a conventional Darlington-connected transistor.
Figure 18:
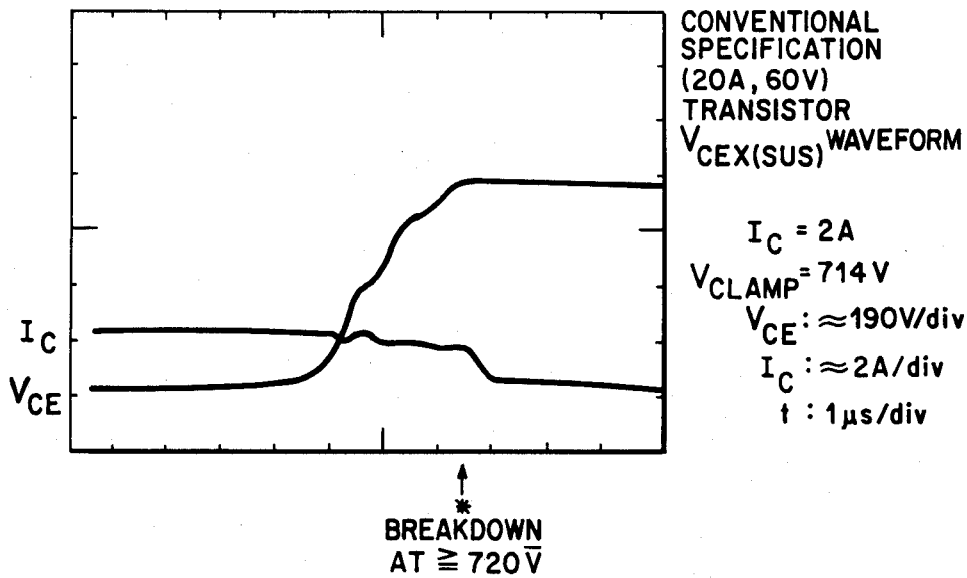
FIGS. 18–23 show test results for various transistors.
Figure 19:
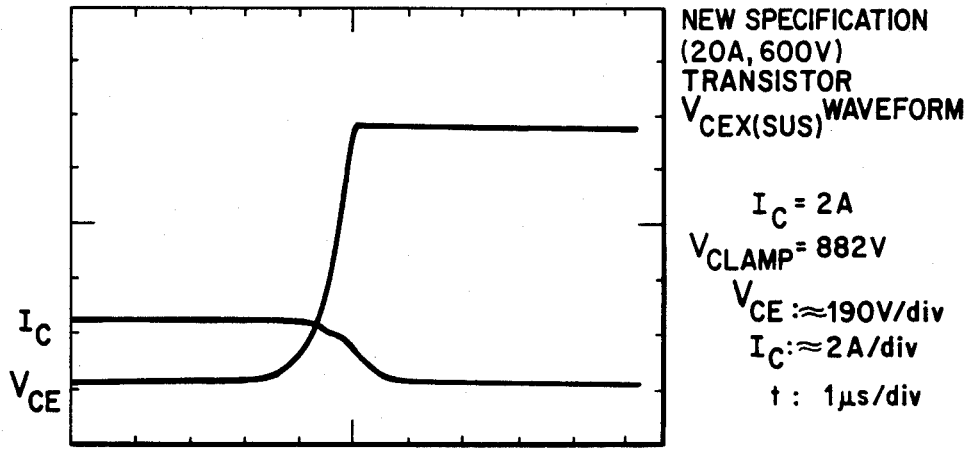
Figure 20:
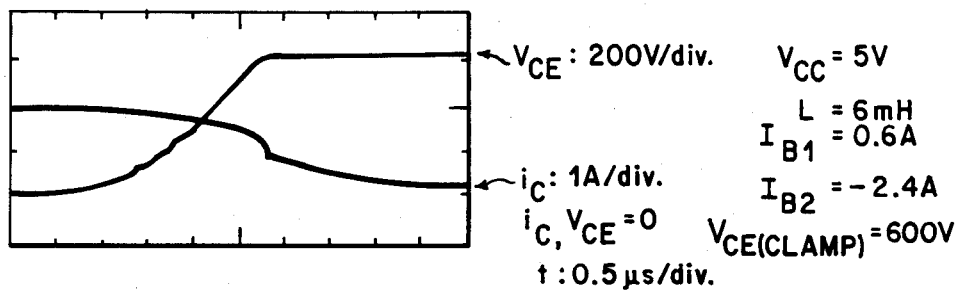
Figure 21:
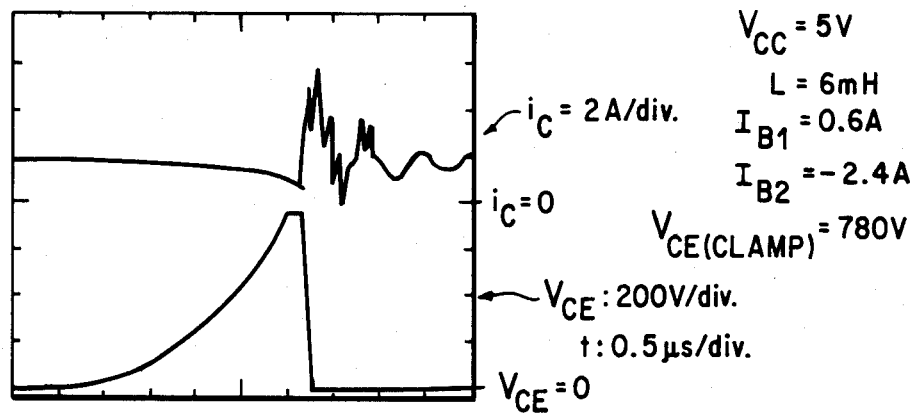

FIGS. 18-19 are measured examples of test results for a 600 V class transistor. FIGS. 20-23 are measured examples of test results for a 1000 V class transistor. Of these, FIGS. 18, 20 and 21 are the data of a conventional structure, as shown in FIG. 4 or FIG. 16d, respectively.

Figure 22:
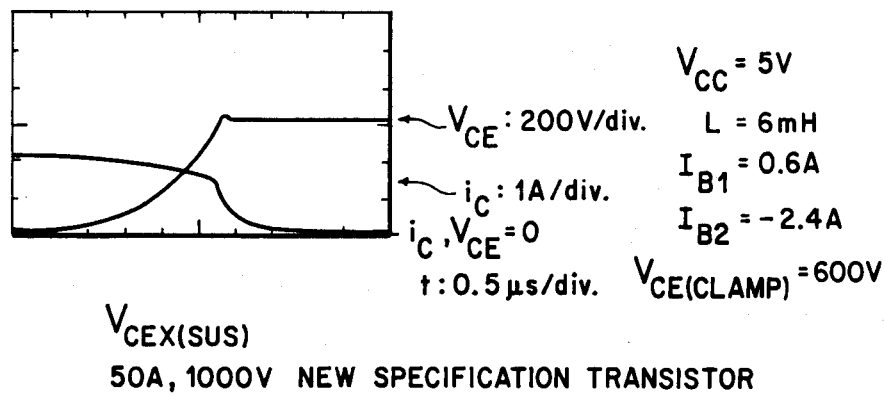
Figure 23:
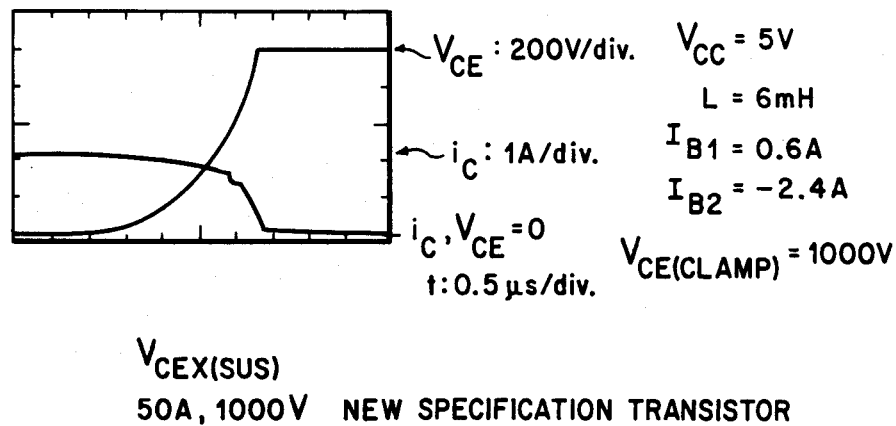
Figure 24:
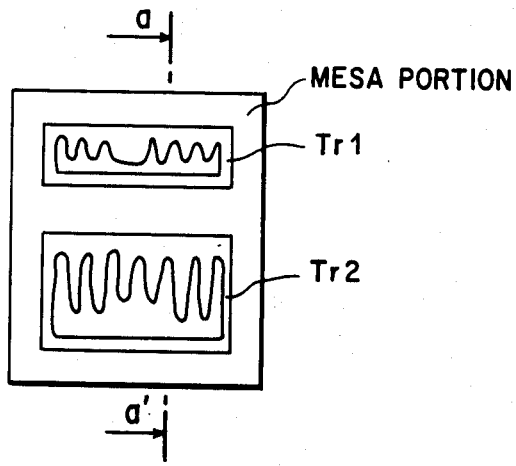
FIG. 24 shows a top plan view of a mesa transistor structure.
Figure 25:
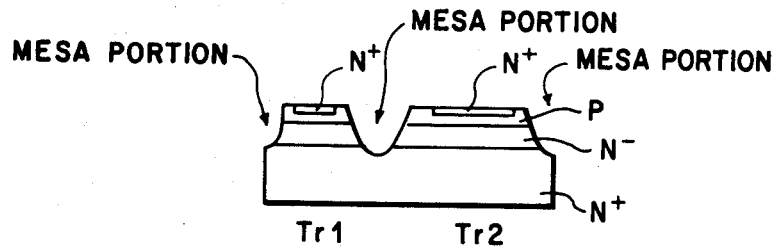
FIG. 25 shows a cross-sectional view of FIG. 24.
Figure 26:
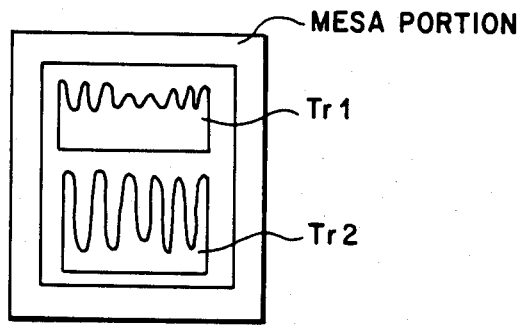
FIG. 26 shows a modified mesa structure.

FIGS. 19, 22 and 23 are the test result data of the structure of FIG. 13 and FIG. 10, respectively.

FIG. 18 is an example immediately before breakdown occurs. After this measurement, in a 720 V measurement, a breakdown phenomenon starts to occur in the vicinity of the point shown by an arrow "↑". The result for the conventional structure indicates that the collector current ($I_C$) continues longer and a breakdown occurs in a lower voltage. The long tail in the collector current curve $I_C$ indicates that at least one portion of the transistor has not been turned OFF. The portion where the OFF operation of the transistor is delayed corresponds to a parasitic transistor operation, as defined hereinabove. However, such a long tail is eliminated by the present invention. In addition, the breakdown points in the 1000 V class transistor occur at fixed points. These breakdown points are marked by "X". It is found that the breakdown tends to occur in the middle of the parasitic transistor, because the current flowing during ON time is small in the parasitic transistor portion on the second state side and because the delay at OFF time is not particularly small as compared with the major portion of the first stage transistor.

Further, although the aforementioned description has been made with respect to a two-stage Darlington-connected transistor structure comprising the front stage transistor and the rear stage transistor in either case, the present invention may effectively be applied to the respective stages of structures having more stages.

INDUSTRIAL APPLICABILITY

The present invention can be applied to a power transistor performing normal pulse width modulation (PWM), which repeats on-off operations in an inverter circuit and a chopper circuit for driving a motor.

What is claimed:

1. In a monolithic power transistor having a Darlington-connected structure, a power transistor having a connecting area between a base of a first stage input transistor and a base of a second stage output transistor forming said Darlington structure, said connecting area including structural means for substantially eliminating type as base areas of the Darlington.

2. A power transistor in accordance with claim 1 wherein said connecting area is within a base diffusion area and wherein there is provided within said connecting area of said base diffusion area a further diffusion area formed separately from an emitter area of said first and second stage transistors and having conductivity different from that of said base diffusion area, said conductivity of said further diffusion area being substantially identical to that of said emitter area.

3. A power transistor in accordance with claim 1 characterized in that said first and second stage transistors are adjacent to each other in a multistage Darlington connection.

4. A power transistor in accordance with claim 1 wherein said connecting area connecting said first and second stage transistors of said Darlington structure comprises an area in a semiconductor substrate thereof, said connecting area having a conductivity type substantially identical to a conductivity type of base areas of the Darlington structure.

5. A power transistor in accordance with claim 1, said means for eliminating parasitic transistors comprising a structural arrangement for connecting a first base area to a second base area of said second transistor, including therein a separating area separating said first and second base areas from each other, said separating area having a conductivity opposite to a conductivity type of said base areas.

6. A power transistor in accordance with claim 5 wherein said structural arrangement further includes a narrow connecting areas of said first and second stage transistors, said connecting area having a conductivity type identical with the conductivity type of said base areas.

7. A power transistor in accordance with claim 6 wherein said area of opposite conductivity to said first and second base areas projects into said connecting area from a collector area.

8. A power transistor in accordance with claim 7 further comprising an additional region formed in said connecting area and having a conductivity type identical to the conductivity type of said emitter area, said additional region having a floating potential level and having a substantially identical depth below an upper surface of a substrate for said monolithic Darlington-connected structure as said emitter area.

9. A monolithic power transistor as recited in claim 1, wherein said connecting area has a narrow lateral dimension.

10. A monolithic power transistor as recited in claim 5, wherein said connecting area has a narrow lateral dimension.

11. A power transistor in accordance with claim 3, wherein said multistage Darlington connection includes at least three transistors.

12. A power transistor as recited in claim 5 wherein said separating area comprises a narrow portion of semiconductor material extending from a substrate doped to provide collector conductivity for said transistors.

13. In a monolithic power transistor having a Darlington-connected structure, a power transistor having a connecting area between a base of a first stage input transistor and a base of a second stage output transistor forming said Darlington structure, said connecting area including structural means for substantially eliminating parasitic transistors therefrom,
said means for substantially eliminating parasitic transistors comprising an additional region, said additional region formed in said connecting area and being of the same conductivity type as said emitters and formed apart therefrom, said additional region having a floating potential level and having a substantially identical depth below a connector as said emitters of said first and second stage transistors.

14. A power transistor in accordance with claim 13 wherein said first transistor stage includes interdigitated emitter and base regions.

15. A power transistor as recited in claim 13 wherein said additional region has a shorter horizontal dimension than said emitters.

16. A power transistor as recited in claim 15 further comprising an isolating layer above said additional region of shorter horizontal dimension than said emitters for isolating said additional region from a conductive layer.

17. A monolithic power transistor having a Darlington connected structure including a first stage transistor and a second stage transistor, said first and second stage transistors having base areas connected by a narrow connecting area in a semiconductor substrate, said narrow connecting area having the same conductivity type as the base areas, the first stage transistor having a base electrode and an emitter electrode which have an interdigitated structure, wherein:
(a) said Darlington connected structure includes in an area adjacent said second stage transistor a portion of semiconductive material substantially identical in conductivity and doping to an emitter area of the interdigitated structure of said first stage transistor, said portion defining limits of said connecting area, a lateral size of said portion, defined in a direction between said first and second stage transistors, being substantially smaller than or equal to a lateral size of the emitter area of the interdigitated structure of said first stage transistor;
(b) the area connecting the first stage transistor and the second stage transistor is substantially free of material of the same conductivity as the emitter area; and
(c) said portion of semiconductive material defining said connecting area being functionally independent of the emitter of the interdigitated structure, thereby substantially eliminating parasitic transistors between said first and second stage transistors.

18. A monolithic power transistor as recited in claim 17 wherein any conductive area of the same conductivity as the emitter area formed in an area other than the area of connection of the first and second stage transistors is functionally unconnected to the emitter area of the first stage transistor.

19. A monolithic power transistor having a Darlington connected structure including a first stage transistor and a second stage transistor, said first and second stage transistors having base areas connected by a narrow connecting area in a semiconductor substrate, said narrow connecting area having the same conductivity type as the base areas, the first stage transistor having a base electrode and an emitter electrode which have an interdigitated structure, wherein:
(a) said narrow connecting area includes a first portion, said first portion formed of semiconductive material substantially identical in conductivity and doping to a base area of the interdigitated structure of said first stage transistor, a lateral size of said portion in the connecting area in a direction between said first and second stage transistors being substantially smaller than or equal to a lateral size of the emitter area of the interdigitated structure of said first stage transistor; and wherein
(b) a second portion, said second portion formed of semiconductive material substantially identical in conductivity to the emitter area in an area other than the first portion between the first stage transistor and the second stage transistor, said second portion being functionally unconnected to said emitter of said interdigitated structure, whereby parasitic transistors are substantially eliminated from the connecting area between said first and second stage transistors.

20. A monolithic power transistor as recited in claim 19 wherein any conductive area of the same conductivity as the emitter area formed in an area other than the area of connection of the first and second stage transistors is functionally unconnected to the emitter area of the first stage transistor.

21. A monolithic power transistor having a Darlington connected structure including a first stage transistor and a second stage transistor, said first and second stage transistors having base areas connected by a connecting area in a semiconductor substrate, the first stage transistor having a base electrode and an emitter electrode which have an interdigitated structure, wherein:
(a) an emitter area of the first stage transistor is formed only in an area of said interdigitated structure; and wherein
(b) an area having a conductivity substantially identical with the conductivity of the emitter area of the first stage transistor is formed in an area adjacent the connecting area connecting the first stage transistor and the second stage transistor for increasing a resistance of said connecting area, whereby parasitic transistors are substantially eliminated from the connecting area between said first and second stage transistors.

22. In a monolithic power transistor having a Darlington-connected structure including first and second stage transistors, said structure comprising a substrate doped to have a first conductivity type and forming a common collector region for said first and second stage transistors, a base region formed within and surrounded by said collector region and doped to have a second conductivity type, said base region forming base elements of said first and second stage transistors, and an emitter region formed within and surrounded by said base region and doped to have said first conductivity type,
the improvement comprising a separating structure for eliminating parasitic transistors between said first and second stage transistors,
said separating structure comprising an upward extension of first conductivity type material from said collector region to form a narrow strip of said first conductivity type material extending vertically through said base region,
said narrow strip of said first conductivity type material separating portions of said base elements of said first and second stage transistors thereby increasing base resistance thereof and eliminating parasitic transistors therebetween.

23. An improved monolithic Darlington power transistor as recited in claim 22 further comprising an isolating layer on said narrow strip of said first conductivity type material extending from said collector region through said base region for isolating said narrow separating strip from a conductive layer connecting an emitter of said first stage transistor to a base portion of said second stage transistor.

24. An improved monolithic Darlington power transistor as recited in claim 23 further comprising an additional region of emitter diffusion within said base region for further separating said bases of said first and second stage transistors.

25. An improved monolithic Darlington power transistor as recited in claim 24 wherein said additional region of emitter diffusion within said base region is isolated by said isolating layer from said conducting layer.

26. An improved monolithic Darlington power transistor as recited in claim 28 wherein said additional region of emitter diffusion has a depth equal to a depth of emitters provided for said first and second stage transistors and has a length shorter than a length of said emitters.

27. An improved monolithic Darlington power transistor as recited in claim 24 wherein said additional region of emitter diffusion has a depth equal to a depth of emitters provided for said first and second stage transistors and has a length shorter than a length of said emitters.

* * * * *

UNITED STATES PATENT AND TRADEMARK OFFICE
CERTIFICATE OF CORRECTION

PATENT NO. : 4,827,322

DATED : May 2, 1989

INVENTOR(S) : Ikunori Takata

It is certified that error appears in the above-identified patent and that said Letters Patent is hereby corrected as shown below:

On the title page, delete the Assignee:

--Mitsubishi Benki Kabushiki Kaisha
Tokyo, Japan--.

Signed and Sealed this

Ninth Day of April, 1991

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,827,322

DATED : May 2, 1989

INVENTOR(S) : Ikunori TAKATA

It is certified that error appears in the above-identified patent and that said Letters Patent is hereby corrected as shown below:

Column 3, line 40, change "THe" to --The--.

Column 4, line 8, change "cross-sectional view" to
--plan view--;

line 35, change "a collectoremitter" to --a collector-emitter--;

line 36, change "through the transistor TrA" to --through the transistor TrA and the diode $D_{\bar{A}}$--.

Column 5, lines 32 to 33, change "$V_F$ ($D_S$, and R1 and R2, respectively, represent layer resistances" to --$V_F(D_S)$, r1 and r2, respectively, represent a forward voltage of $D_S$ and layer resistances--.

Column 6, line 2, change "However, in this portion of the circuit" to --However, for delaying at OFF time, in this portion of the circuit--.

Column 9, line 2, change "Fig. 13 and Fig. 10" to --Fig. 13 or Fig. 10--;

line 43, change "type as base areas of the Darlington" to --parasitic transistors therefrom--.

Column 12, line 57, change "in claim 28" to --in claim 25--.

UNITED STATES PATENT AND TRADEMARK OFFICE
CERTIFICATE OF CORRECTION

PATENT NO. : 4,827,322
DATED : May 2, 1989
INVENTOR(S) : Ikunori TAKATA

It is certified that error appears in the above-identified patent and that said Letters Patent is hereby corrected as shown below:

Please correct Figures 4 and 5 as shown

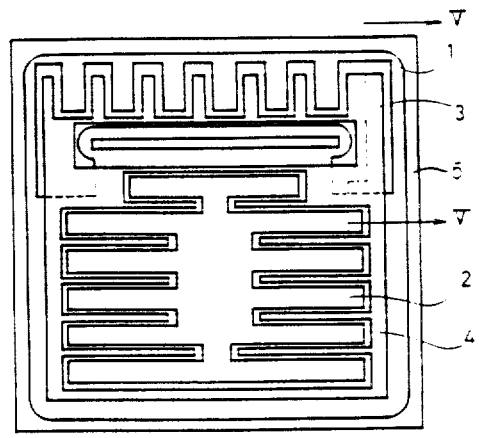

FIG.4 PRIOR ART

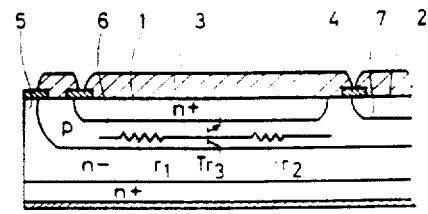

FIG.5

UNITED STATES PATENT AND TRADEMARK OFFICE
CERTIFICATE OF CORRECTION

PATENT NO. : 4,827,322

DATED : May 2, 1989

INVENTOR(S) : Ikunori TAKATA

It is certified that error appears in the above-identified patent and that said Letters Patent is hereby corrected as shown below:

Please correct Figure 16 as shown

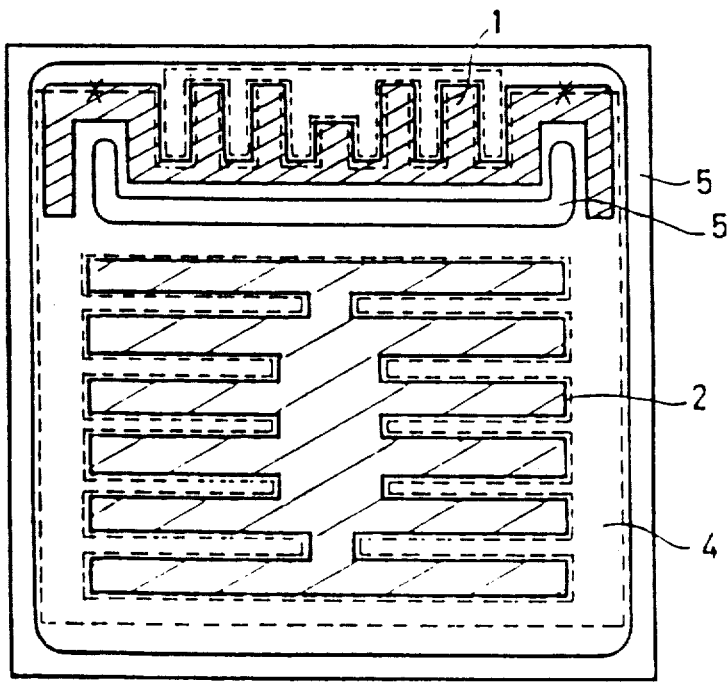

FIG. 16

UNITED STATES PATENT AND TRADEMARK OFFICE
CERTIFICATE OF CORRECTION

PATENT NO. : 4,827,322
DATED : May 2, 1989
INVENTOR(S) : Ikunori TAKATA

It is certified that error appears in the above-identified patent and that said Letters Patent is hereby corrected as shown below:

Please correct Figure 18 as shown

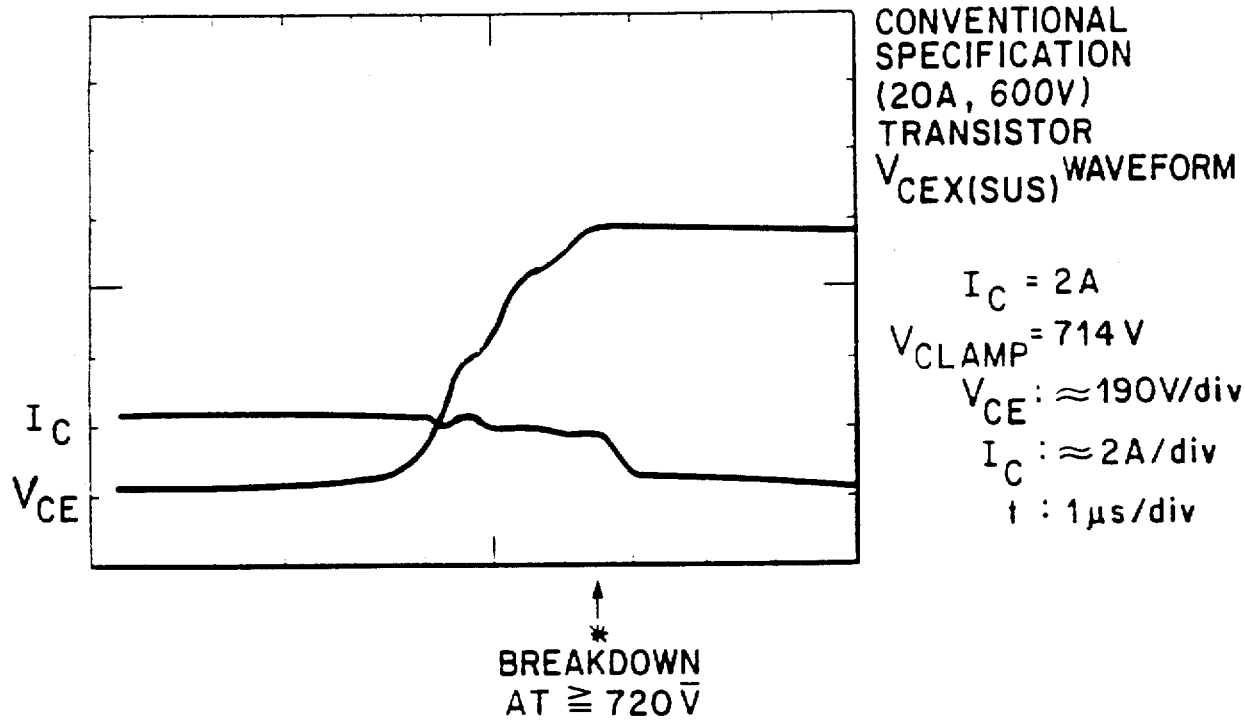

FIG. 18

UNITED STATES PATENT AND TRADEMARK OFFICE
CERTIFICATE OF CORRECTION

PATENT NO. : 4,827,322
DATED : May 2, 1989
INVENTOR(S) : Ikunori TAKATA

It is certified that error appears in the above-identified patent and that said Letters Patent is hereby corrected as shown below:

Please correct Figures 27 and 30 as shown

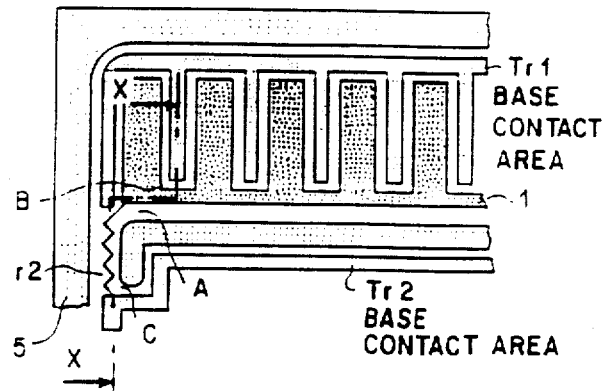

FIG. 27

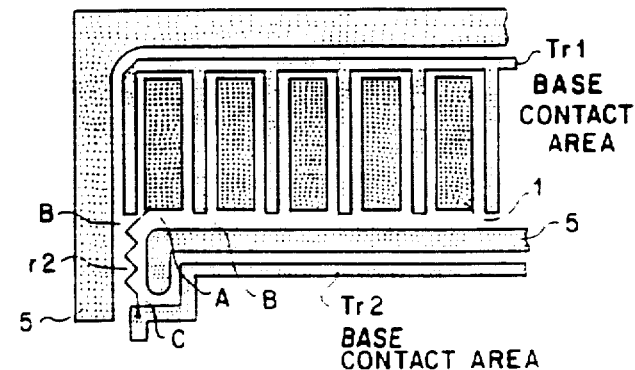

FIG. 30